United States Patent
Atti et al.

(10) Patent No.: US 7,212,437 B2
(45) Date of Patent: May 1, 2007

(54) CHARGE COUPLED EEPROM DEVICE AND CORRESPONDING METHOD OF OPERATION

(76) Inventors: Massimo Atti, Raintaler Str. 36A, München (DE) 81539; Christoph Deml, Emdenstrasse 17, München (DE) 81735

( * ) Notice: Subject to any disclaimer, the term of this patent is extended or adjusted under 35 U.S.C. 154(b) by 234 days.

(21) Appl. No.: 10/482,682

(22) PCT Filed: Jul. 2, 2001

(86) PCT No.: PCT/EP01/07542

§ 371 (c)(1),
(2), (4) Date: Dec. 31, 2003

(87) PCT Pub. No.: WO03/005371

PCT Pub. Date: Jan. 16, 2003

(65) Prior Publication Data

US 2004/0202021 A1 Oct. 14, 2004

(51) Int. Cl.
G11C 16/04 (2006.01)
G11C 14/00 (2006.01)
H01L 29/788 (2006.01)
H01L 21/336 (2006.01)

(52) U.S. Cl. ............. 365/185.05; 365/185.08; 365/185.14; 365/185.18; 365/185.27; 257/318; 257/320; 257/322; 257/E21.421

(58) Field of Classification Search ........... 365/185.01, 365/185.05, 185.1, 185.17
See application file for complete search history.

(56) References Cited

U.S. PATENT DOCUMENTS

| 4,040,017 | A | | 8/1977 | Lee |
| 4,230,954 | A | | 10/1980 | Heller |
| 5,606,527 | A | * | 2/1997 | Kwack et al. ............... 365/201 |
| 5,706,241 | A | | 1/1998 | Nakamura et al. |
| 6,411,548 | B1 | * | 6/2002 | Sakui et al. ........... 365/185.17 |
| 6,418,052 | B1 | * | 7/2002 | Shibata et al. ......... 365/185.12 |
| 6,812,521 | B1 | * | 11/2004 | He et al. ..................... 257/319 |
| 2002/0097596 | A1 | * | 7/2002 | Atsumi et al. ................ 365/63 |
| 2002/0127798 | A1 | * | 9/2002 | Prall ........................... 438/257 |
| 2004/0202021 | A1 | * | 10/2004 | Atti et al. .............. 365/185.03 |

FOREIGN PATENT DOCUMENTS

| DE | 24 34 936 | 2/1976 |
| EP | 57005362 | 1/1982 |

OTHER PUBLICATIONS

S.K. Lahiri, "MNOS/Floating-Gate Charge Coupled Devices for High Density EEPROMS: A New Concept," Physics of Semiconductor Devices, vol. 3316, No. 2, pp. 951-956, XP001035171.
Patent Abstracts of Japan, vol. 006, No. 064, Apr. 23, 1982, & JP 57 005362 A, Jan. 12, 1982, Abstract.

* cited by examiner

Primary Examiner—Amir Zarabian
Assistant Examiner—Ly Duy Pham
(74) Attorney, Agent, or Firm—Morrison & Foerster LLP

(57) ABSTRACT

This invention provides a semiconductor memory device and a corresponding method of operation. The semiconductor memory device comprises a semiconductor substrate having a first conductivity; a plurality of gate structures for storing charge in a non-volatile manner regularly arranged in above the surface of the semiconductor substrate and electrically isolated therefrom; a plurality of wordlines, each of the gate structures being connected to one of the wordlines and a group of the gate structures being connected to a common wordline; and a plurality of active regions, each of the active regions being individually connectable to at least one of the gate structures.

12 Claims, 10 Drawing Sheets

FIG 5
a)
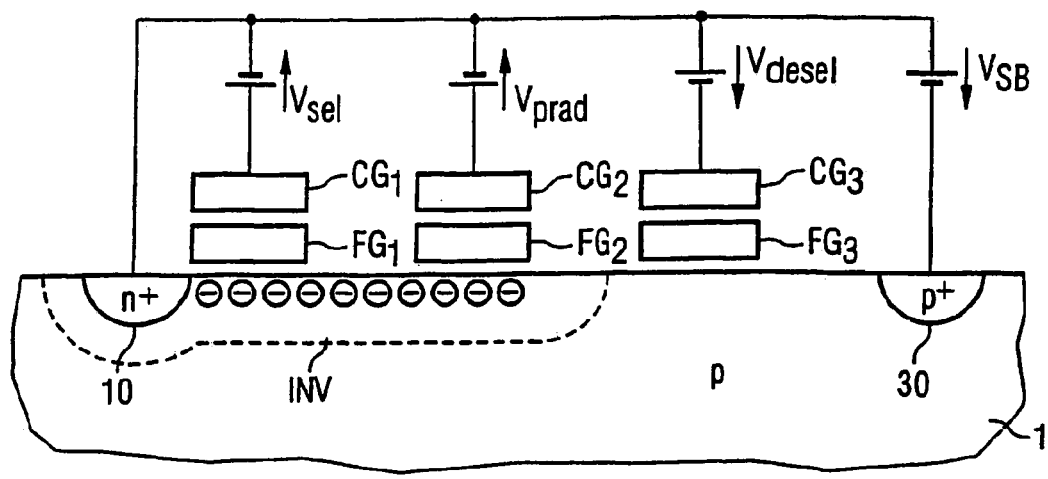
b)
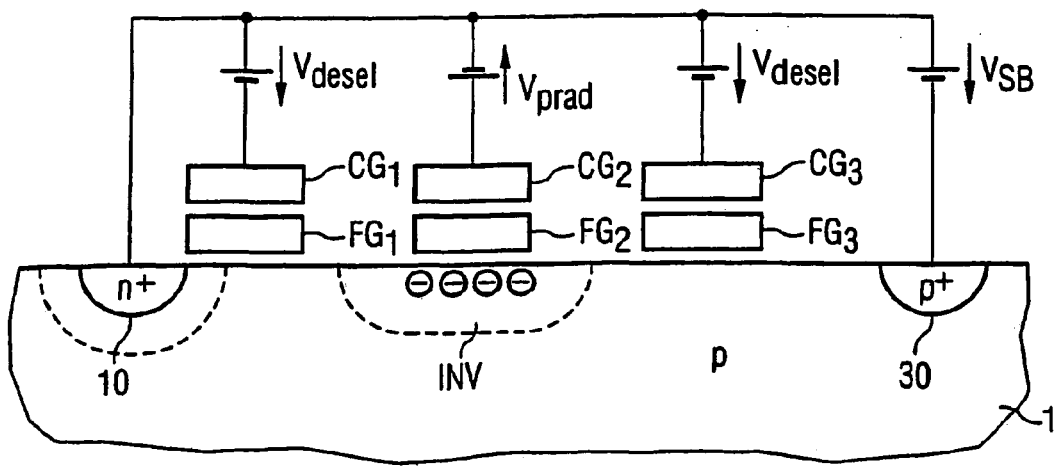

FIG 6
a)
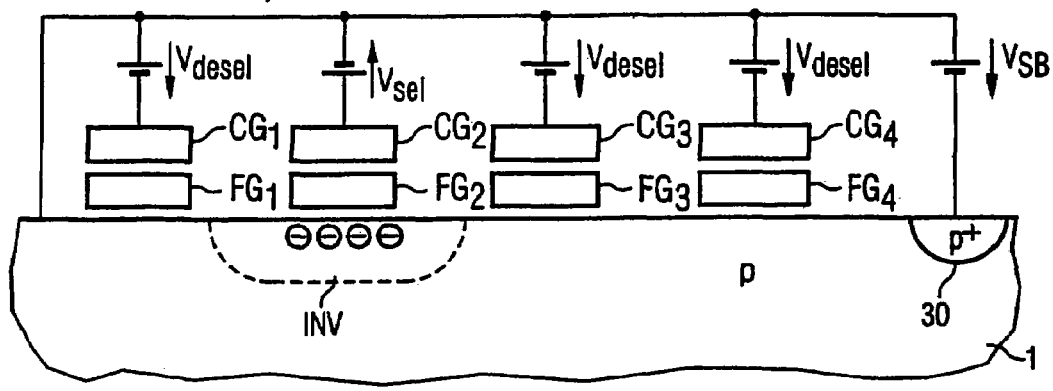
b)
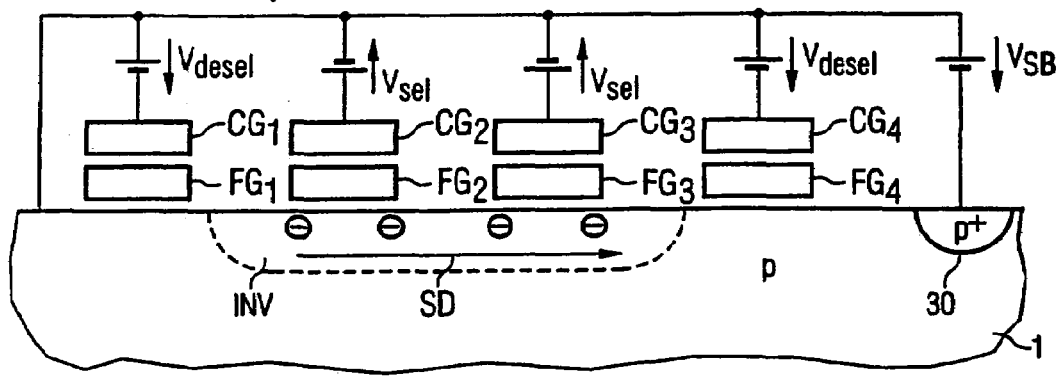
c)
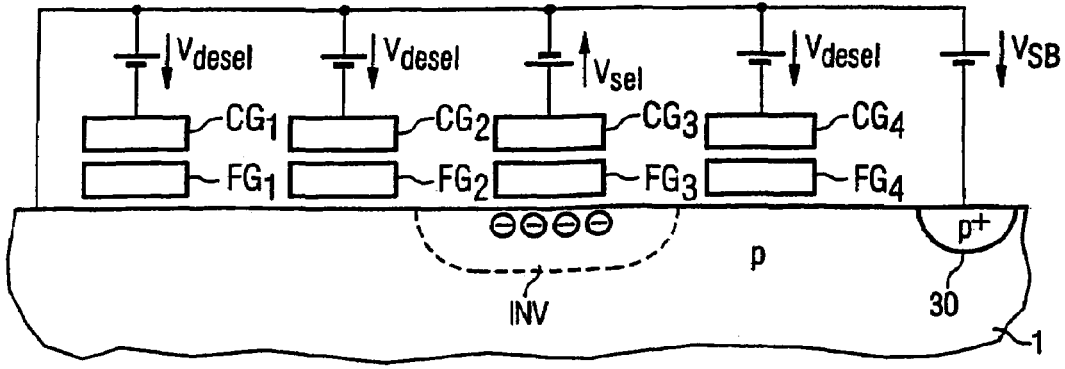

FIG 10
a)
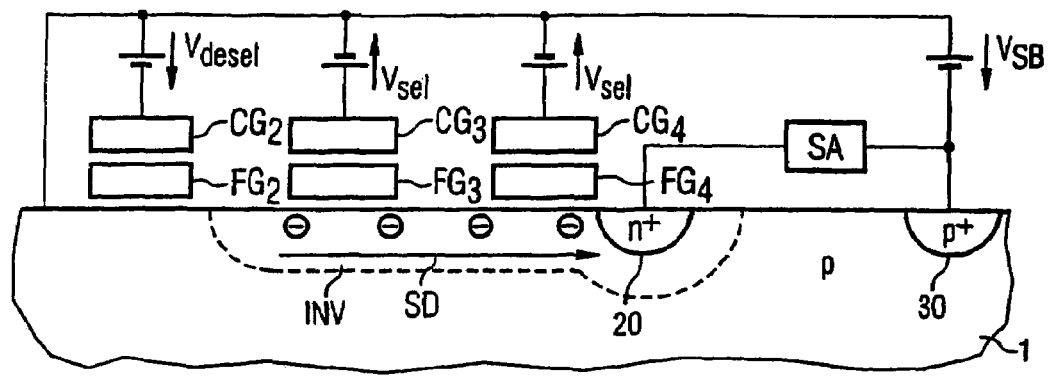
b)
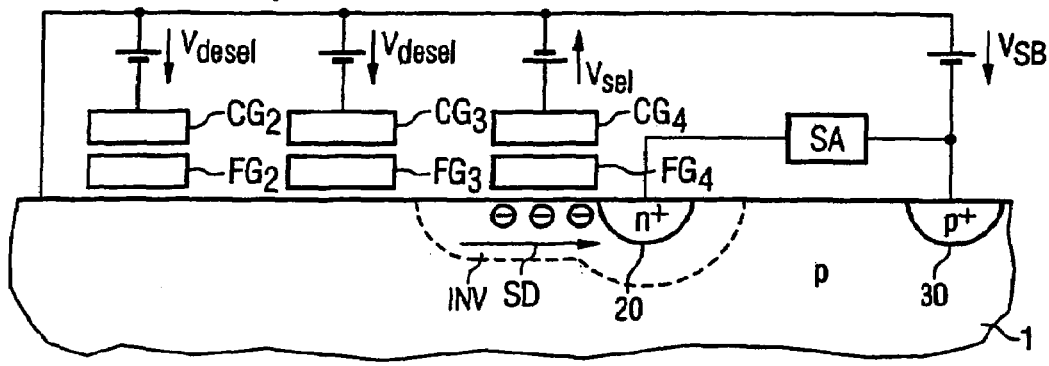
c)
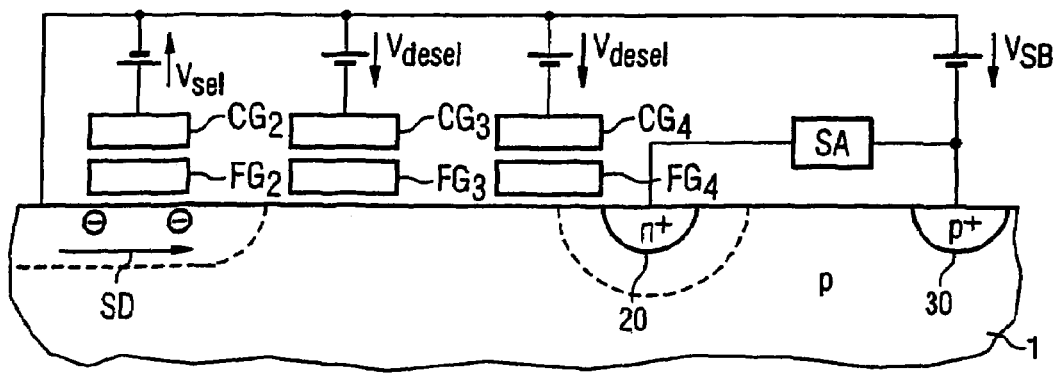

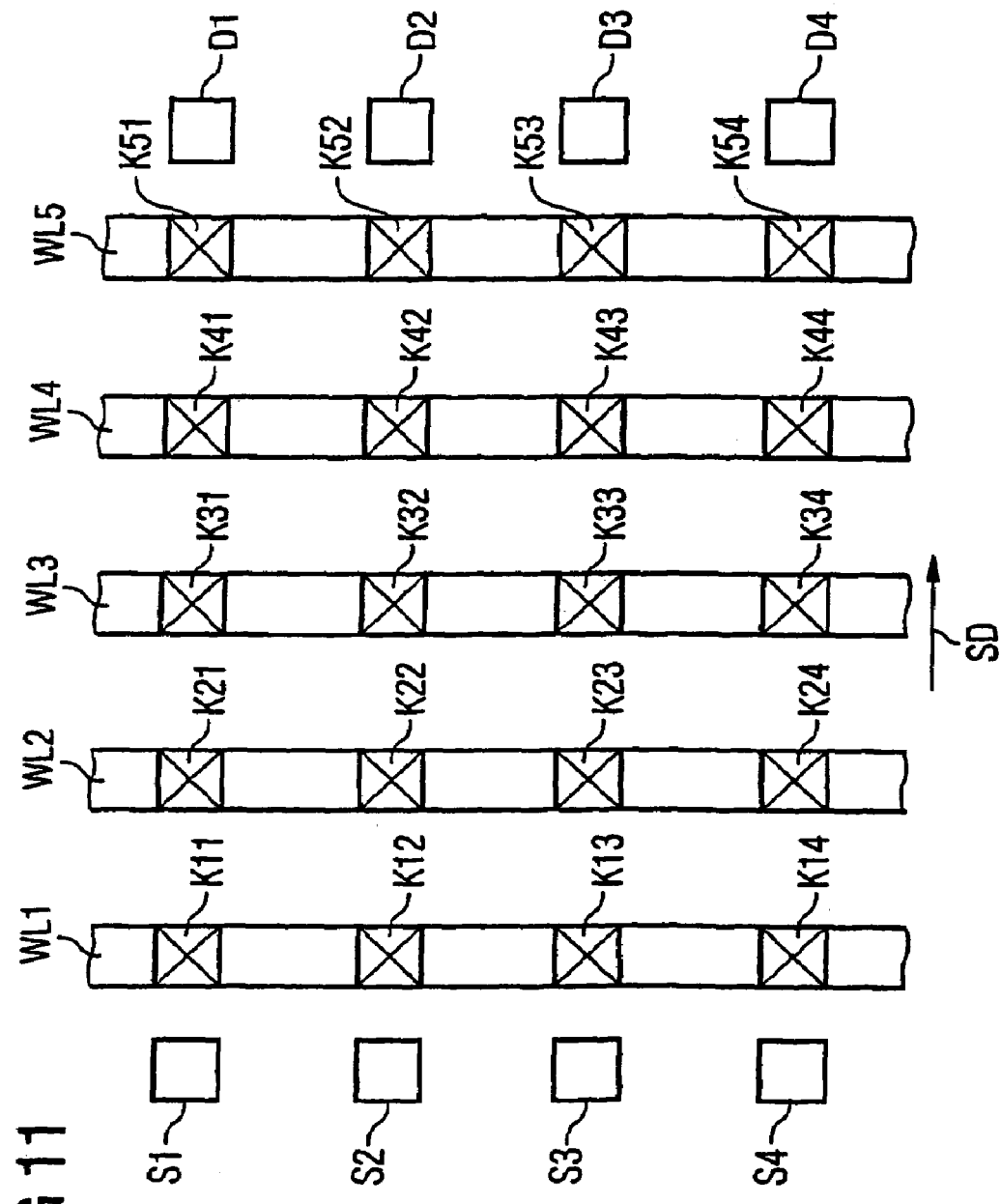

CHARGE COUPLED EEPROM DEVICE AND CORRESPONDING METHOD OF OPERATION

CLAIM FOR PRIORITY

This is a national stage application of PCT/EP01/07542, filed Jul. 2, 2001.

TECHNICAL FIELD OF THE INVENTION

The present invention relates to a semiconductor memory device and a corresponding method of operation.

BACKGROUND OF THE INVENTION

S. K. Lahiri: MNOS/Floating-Gate Charge Coupled Devices for High Density EEPROMs: A New Concept, Physics of Semiconductor Devices, V. Kumar and S. K. Agarwal (eds.), Narosa Publishing House, New Delhi, India, 1998, pages 951–956, the basic idea of CCD EEPROMS is known. Particularly, this conference paper discloses the general idea to arrange EEPROM gate structures each having a floating and a control (CCD) gate above a substrate in rows separated by rails of active areas or injectors provided in said substrate. However, S. K. Lahiri fails to disclose a suitable memory address scheme for such a CCD EEPROM taking into consideration a dynamic clocking. Moreover, this document also fails to disclose appropriate cells layouts and operation modi.

For example, CCD devices are known from W. S. Boyle, G. E. Smith: Charge Coupled Semiconductor Devices. The Bell System Technical Journal. American Telephone and Telegraph Company: New York, April 1970. Pages 587–593; Rudolf Müller: Bauelemente der Halbleiter-Elektronik. Springer Verlag: Berlin, Heidelberg, New York, London, Paris, Tokyo 1987. Seiten 192–195; Kurt Hoffmann: VLSI-Entwurf. Modelle und Schaltungen. Oldenbourg Verlag: München, Wien 1996. Seiten 296–297; and Lev I. Berger: Semiconductor Materials. CRC-Press: 1997. Page 445.

EEPROM devices are generally well known in the state of the art. EEPROM cells are used to store information, which should be still accessible after switching the power supply off and on again, while being able to modify the stored information multiple times by pure electrical means. EEPROM cells usually have source and drain contacts forming a MOS transistor. Information is read out by measuring the attributes of the output characteristic, which is dependent of the information stored in a gate structure having floating and control gate.

The overall transfer characteristic (programming conditions to read current) is highly nonlinear and strong dependent on several side effects and production fluctuations. I.e. the Fowler Nordheim tunneling current is more than exponentially dependent on the electric field across the oxide. So the programming voltage and the oxide thickness have severe influence on the programming process. Thus, these parameters must be adjusted with high precision. These accuracy problems limit the multilevel ability of known cell concepts to 2 bits per cell.

Fast cells are critical and must be handled with complex algorithms. Usually, only cells of a single wordline can be programmed at the same time. During sensing, there is a static current consumption through S and D of the MOS transistor. During parallel programming of cells in the test phase, there is a static current due to the gate induced drain leakage, which must be supplied by a charge pump. This current driving pump is area consuming.

Using drain and source contacts, the cell area of typical cells in embedded EEPROM modules results in $22*F^2$ to $70*F^2$. The world record for cells with drain and source contacts is $8.8*F^2$.

Nowadays new applications for non-volatile memories are borne, one of that is the possibility to store photos or music in solid state device. In this kind of application is required a sequential data access to the memory.

SUMMARY OF THE INVENTION

The present invention provide an improved semiconductor memory device and a corresponding method of operation providing sequential data access.

One embodiment of the present invention combines the charge shifting, receiving or providing (from now on denoted only by shifting) ability and the possibility to store charge non-volatile in an oxide or on a floating gate (EEPROM) or a similar structure. The device or memory cells according to the invention will therefore be called charge coupled EEPROM cells or CC-EEPROM cells herein below.

In fact, by combining CCD and EEPROM technologies, it is possible to increase the density of the memory and—at the same time—to build a non-volatile memory that is sequentially addressable itself and even usable as a volatile memory.

CCD technique is known to operate with 8 bit resolution. In combination with the linear transfer characteristic of the charge coupled EEPROM and the self limiting programming, this should provide deep multilevel ability. Fast cells do not have any influence on the programming process, because the programming stops, when all charge carriers tunneled to the floating gate. It is possible, to shift charge carriers into the cell area and to program a huge number of wordlines in parallel. This cuts the programming time of some order of magnitude. There is no static current consumption during read. Minimum size cells ($4F^2$) are possible, because the cell does not have drain or source contacts. Reduction of logic in the bitline and wordline section result in less chip area. There is an additional volatile memory functionality (i.e. using the same technology, it is also possible to implement high density memory buffer).

According to a preferred embodiment, a plurality of wordlines is provided and a respective group of the gate structures being connected to a respective wordline.

According to another preferred embodiment, the plurality of gate structures for storing charge in a non-volatile manner is arranged in rows and columns.

According to another preferred embodiment, each row has an associated first active region located at a first end of the row.

According to another preferred embodiment, each row has an associated second active region located at a second end of the row.

According to another preferred embodiment, the wordlines are located above the columns.

According to another preferred embodiment, between each of the active regions and the at least one of the gate structures a gate structure for storing charge in a volatile manner is arranged.

According to another preferred embodiment, a voltage generation device for applying individual voltages between the wordlines and the active regions such that charge may be programmed, read, shifted, and erased from the gate structures is provided.

According to another preferred embodiment, the substrate includes a body contact which is connected to the voltage generation device for applying individual voltages between the wordlines, the active regions and the substrate.

According to another preferred embodiment, the doping of the substrate is non-uniformly under the gate structures on the one hand and under a spacing between two of the gate structures of the other.

According to another preferred embodiment, a sense amplifier connected to the active regions.

According to another preferred embodiment, a gate for separating the at least one active region from the gate structures to selectively connect the at least one active region to the gate structures for programming or reading said gate structures is provided.

According to another preferred embodiment, a programming of a gate structure is arranged by supplying it with a programming voltage and by supplying the other gate structures of the corresponding row with a select voltage which is greater than the programming voltage.

According to another preferred embodiment, a programming of a gate structure is arranged by supplying it with a programming voltage and by supplying the gate structures of the corresponding row lying between the gate structure and the active region with a select voltage which is greater than the programming voltage.

According to another preferred embodiment, a programming of a gate structure is arranged by adjusting a charge quantity to be programmed under one of the gate structures; shifting the charge quantity to be programmed from said one of said gate structures to another one of the gate structures; and programming said charge quantity to the another one of the gate structures.

According to another preferred embodiment, a programming of a gate structure is arranged by adjusting a charge quantity to be programmed beneath a gate structure to be programmed; and programming the charge quantity to the gate structure.

According to another preferred embodiment, a reading of a gate structure is arranged by supplying it with a read voltage and by supplying the other gate structures of the corresponding row with a select voltage which is greater than said read voltage such that there is a static current flow between a first and second active region connected to the ends of the row; and by sensing the static current flow.

According to another preferred embodiment, a read adjusting of a gate structure is arranged by adjusting a charge quantity to be read under one of the gate structures by supplying it with a read adjust voltage and by supplying the gate structures of the corresponding row lying between the gate structure and the active region with a select voltage which is greater than the read adjust voltage.

According to another preferred embodiment, a reading of a gate structure is arranged by said charge quantity to be read being shifted from the one of the gate structures to one of the active regions and sensed by a sense amplifier connected thereto.

According to another preferred embodiment, an erase operation is performed by applying an erase voltage across at least one of the gate structures and said substrate.

According to another preferred embodiment, a multilevel programming of the gate structures is performed.

According to another preferred embodiment, a block programming is performed by adjusting a respective programming charge beneath a plurality of the gate structures to be programmed and by simultaneously programming the plurality of the gate structures by applying a programming voltage.

According to another preferred embodiment, the semiconductor memory device according to the invention is used as a volatile memory.

BRIEF DESCRIPTION OF THE DRAWINGS

Embodiments of the present invention are illustrated in the accompanying drawings and described in detail in the following.

In the Figures:

FIGS. 5a,b show the adjust charge mode for programming a limited charge for a specific gate structure of the CC-EEPROM cell arrangement according to the embodiment of the invention.

FIGS. 6a–c show the charge shifting mode for shifting a limited charge for a specific gate structure of the CC-EEPROM cell arrangement according to the embodiment of the invention.

FIGS. 10a–c show the charge sink and sense amplifier for a specific gate structure of the CC-EEPROM cell arrangement according to the embodiment of the invention.

FIG. 11 shows a possible two-dimensional CC-EEPROM cell arrangement according to an embodiment of the invention.

Throughout the figures the same reference numbers indicate the same or functionally equivalent means. It should be noted that the individual figures for explaining specific modes of operation do not include all details, but just the details needed for explaining the respective mode.

DETAILED DESCRIPTION OF THE INVENTION

Figure 1:
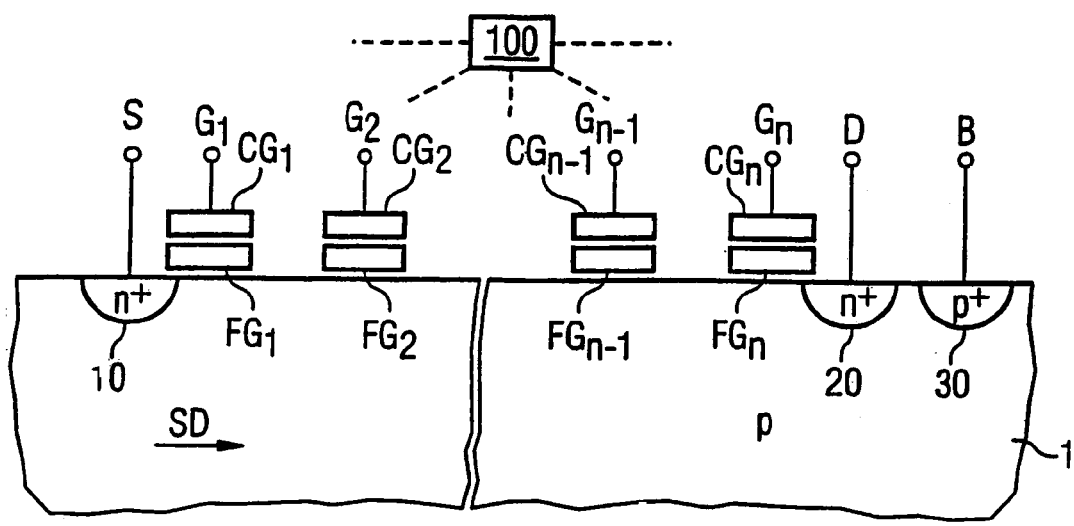
FIG. 1 shows a CC-EEPROM cell arrangement according to an embodiment of the invention.

FIG. 1 shows a CC-EEPROM cell arrangement according to a embodiment of the invention in a schematic representation.

In FIG. 1, reference sign 1 denotes a p-type semiconductor substrate, e.g. a silicon substrate, having an $n^+$-type source and drain region 10 and 20, respectively, and having a $p^+$-type body contact 30.

Between the $n^+$-type source and drain regions 10, 20 there is a plurality of aligned gate structures. The gate structures include floating gates FG1, FG2, ..., FGn−1, and FGn above the substrate surface and electrically isolated therefrom. Moreover, each of the floating gates FG1, FG2, ..., FGn−1, and FGn has a corresponding control gate CG1, CG2, ..., CGn−1, CGn which is electrically isolated therefrom. Thus the gate structures are similar to the gate structure of an EEPROM, however, here a plurality of gate structures each consisting of a floating and control gate pair is aligned with preferably equidistant spacing.

S, G1, G2, ..., Gn−1, Gn, D, B denote respective contacts of the corresponding source, drain, bulk, and gate regions. Only schematically shown in FIG. 1 is a voltage generation device 100 for applying individual voltages between said gate structures CG1, FG1; ...; CGn, FGn and said active regions 10, 20 and body contact 30 such that charge may be programmed, read, shifted, and erased from said gate structures CG1, FG1; ...; CGn, FGn. The voltage generation device 100 is connected to the respective contacts of the corresponding source, drain, bulk, and gate regions S, G1, G2, ..., Gn−1, Gn, D, B. The associated functions will be described later.

The direction SD pointing from the source region 10 to the drain region 20 along the gate structures is called shifting direction. In this shifting direction SD, the intermediate cell gate structures are not flanked by a heavy source/drain doping like in normal EEPROM cells or MOS transistors—otherwise the charge isolating and conserving capability for the adjusted charge to be described later would vanish. However, to a certain limit, light source/drain doping may be acceptable.

The CC-EEPROM cell arrangement of FIG. 1 is arranged in a way, that charge can be shifted from one gate structure to another, i.e. CCD like. The cell arrangement contains a minimum of one non-volatile cell. Gate structures of this arrangement need not all to be non-volatile cells (e.g. there may be gates just for shifting, gates just supplying volatile memory or gates next to a heavy source or drain doping) or need not all to be used for non-volatile storing (e.g. there may be dummy cells or gates next to a heavy source or drain doping). The gate alignment needs not to have straight line characteristic, but meander, tree, parallel, ... structures are also possible.

The arrangement normally has a minimum of one contacted or uncontacted source/drain doping, which can act as a charge source or sink. This doping can be located on the beginning or end (edge) of the arrangement. There might be a bulk contact. Bulk can but needs not to be isolated from the substrate by any means (junction, oxide, insulator). A minimum cell area is feasible due to the minimum number of drain and source contacts.

Doping is somehow a subject for trade off (see below) and can be done non-uniformly or differently under the tunnel oxide on the one hand and under the spacing between two gates of the other. However, also uniform doping is possible.

For shifting inversion charge from one gate structure to the other, the depletion regions, which are induced by these gates, must touch laterally. This is achieved at relatively low or medium voltages, when the effective doping between these gates is low. Thus, a low intrinsic bulk doping or a contra doping is preferred.

Programming voltage is shared by the inter poly oxide (between floating and control gate), the tunnel oxide (both effects known from normal EEPROM cells) and an unwanted, extending depletion region under the cell.

In order to achieve the electrical field in the tunnel oxide, needed for Fowler Nordheim tunneling, at a minimum programming voltage, this depletion region can be limited by a heavy doping beneath the tunnel oxide, eventually spaced to the semiconductor surface.

Heavy doping is in contradiction to the need mentioned above regarding charge shifting. Therefore, the above mentioned trade-off should be found in practice. In any case, low doping is needed only at the surface.

Generation and recombination limit the available time after start of adjusting charge quantities to completion of reading or programming. The buried CCD approach known from R. H. Walden, R. H. Krambeck, R. J. Strain, J. McKenna, N. L. Schryer, G. E. Smith: The Buried Channel Charge Coupled Devices. The Bell System Technical Journal. American Telephone and Telegraph Company: New York, September 1972. Pages 1635–1640; and D. J. Burt: Basic Operation of the Charge Coupled Device. Proc. Int. Conf. Technol. Applic. CCD. Edinburgh University: Edinburgh 1974, Pages 1–12, which is used to cope with the high generation and recombination at the semiconductor/oxide interface, increases the read immunity and requires increased program voltage.

Figure 2:
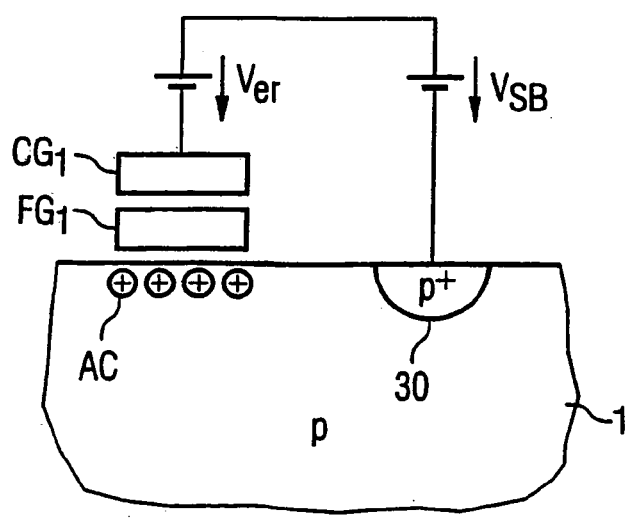
FIG. 2 shows the erase mode for a specific gate structure of the CC-EEPROM cell arrangement according to the embodiment of the invention.

FIG. 2 shows the erase mode for a specific single gate structure CG1, FG1 of the CC-EEPROM cell arrangement according to the embodiment of the invention.

In order to explain that this embodiment of the invention is compatible with normal non-volatile memory operation, here is showed, how to erase one cell having control gate CG1 and floating gate FG1 or all in parallel, applying appropriate bias and using the well known Fowler Nordheim tunneling.

Erasing is done by applying an electrical field to the tunnel oxide in the orientation, that majority charge carriers, here holes (+), are accumulating on the semiconductor surface in an accumulation region AC. Thereby, electrons (−) stored in the floating gate FG1 may be extracted. Therefore, an erase voltage $V_{er}$ is applied across a minimum of one CCD cell line bulk on the one hand and a minimum or one cell control gate on the other. This erase voltage $V_{er}$ of typically 16–18 V physically adds to the source-bulk-voltage $V_{SB}$ of typically >−0,7 V. It should be mentioned that here and in the following description all voltages are referred to the source voltage, however, this is just one of several possibilities.

Erase is not self-limiting and cells behave differently, so one or more read verify plus program cycles may complete the erase step.

Next, programming of the CC-EEPROM cells will be explained. In known memory devices, programming was always performed with unlimited charge for a predetermined time period. However, according to this embodiment programming can either be done with unlimited charge or with limited charge.

Particularly, programming with an unlimited charge source provides a random access possibility.

Programming voltage and/or programming time adjust the amount of charge, which is tunneling from the inversion layer through the tunnel oxide to the floating gate (Fowler Nordheim tunneling) or is injected into the tunnel oxide (channel hot electron).

Figure 3:
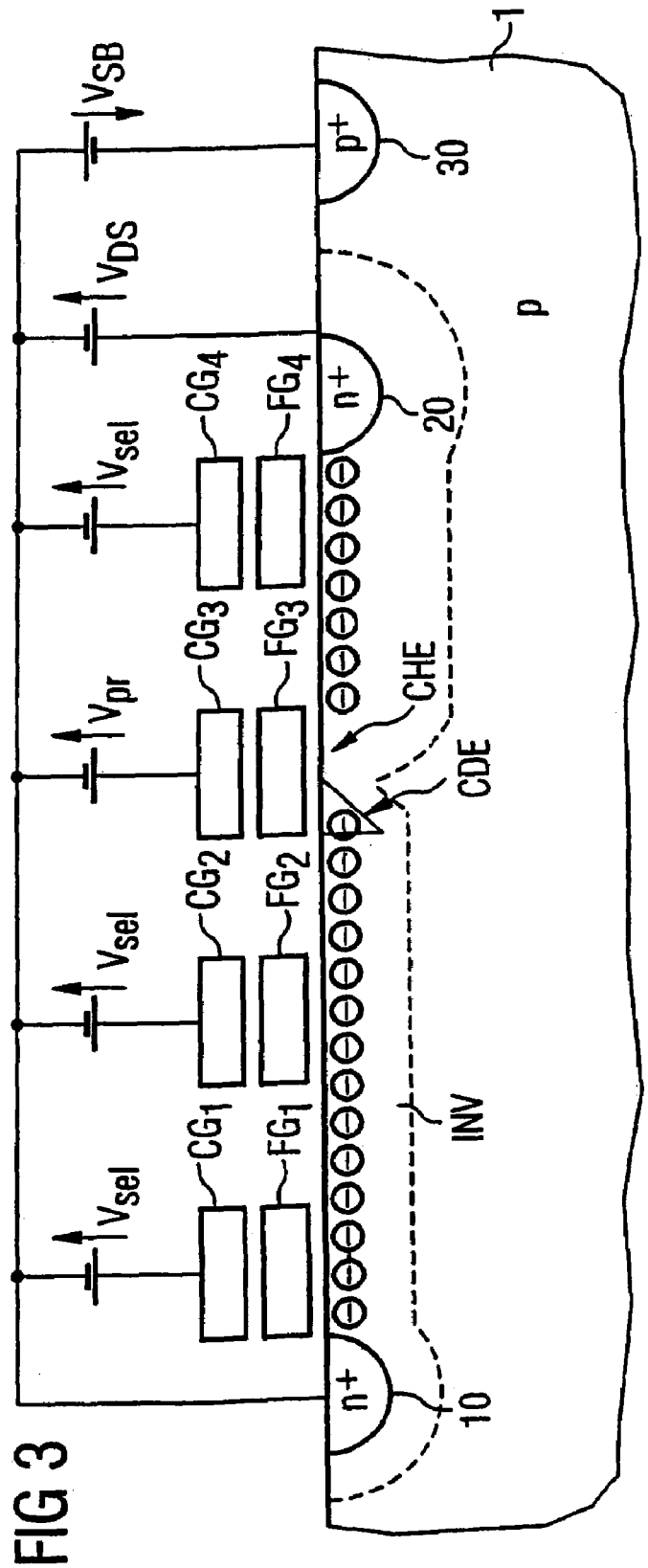
FIG. 3 shows the channel hot electron programming mode for a specific gate structure of the CC-EEPROM cell arrangement according to the embodiment of the invention.

FIG. 3 shows the channel hot electron programming mode for a specific gate structure of the CC-EEPROM cell arrangement according to the embodiment of the invention.

This structure is operated somehow similar to a NAND CHE (channel hot electron) EEPROM. The source/drain doping inbetween two cells is functionally substituted by supplying an appropriate $V_{sel}$ to all cells, which should not be programmed, so that the gaps between cells have a continuous inversion layer INV. The cell having the gate structure FG3, CG3 to be programmed is supplied with a programming voltage $V_{pr}$ which is smaller than $V_{sel}$, while $V_{sel}$ is greater than $V_{DS}$. These voltages add to the source-bulk-voltage $V_{SB}$.

By supplying these voltages, a charge density CDE is created below the gate structure FG3, CG3. At the location where this charge density CDE is nearly zero, a channel hot electron region CHE is created from where hot electrons can enter into the floating gate FG3.

It should be noted that when using channel hot electron programming, it is also possible to use a SONOS gate structure leaving out the floating gate, as described in Boaz Eitan, Paolo Pavan, Ilar Bloom, Efraim Aloni, Aviv Frommer, David Finzi: NROM: A Novel Localized Trapping, 2-Bit Nonvolatile Memory Cell. IEEE Electron Device Letters, Vol. 21, No. 11. IEEE: November 2000. Pages 543–545.

Figure 4:
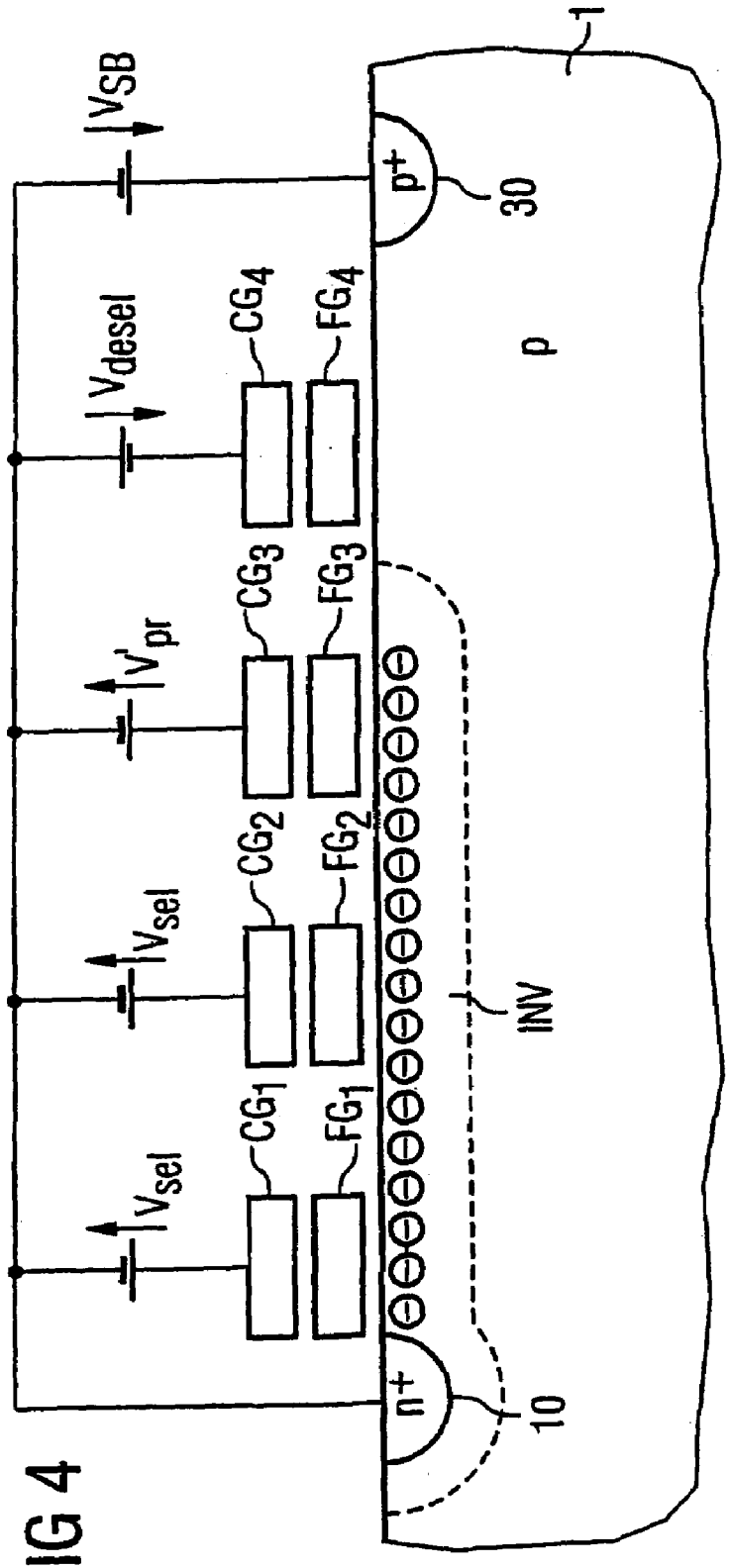
FIG. 4 shows the Fowler Nordheim programming mode for a specific gate structure of the CC-EEPROM cell arrangement according to the embodiment of the invention.

FIG. 4 shows the Fowler Nordheim programming mode for a specific gate structure of the CC-EEPROM cell arrangement according to the embodiment of the invention with unlimited charge source.

An inversion layer INV is built up from the source 10 to the cell having the gate structure FG3, CG3 which should be programmed. This can be done by selecting and deselecting other cells in an appropriate manner or by another special gate structure, which is placed near by every cell (e.g. in the third dimension).

Here, the select voltage $V_{sel}$ is applied to the two left hand cells and a deselect voltage $V_{desel}$ is applied to the right hand neighbour cell. The cell having the gate structure FG3, CG3 to be programmed is supplied with a programming voltage $V'_{pr}$ which is greater than $V_{pr}$ in the case of channel hot electron programming. Fowler Nordheim programming mode has the advantage that it is current saving in comparison to channel hot electron programming, because no current flow exists between source and drain 10, 20.

Next, programming with a limited charge will be explained. Programming with a limited charge source is done in three steps: adjusting charge quantity, shifting the charge to the cell to be programmed and finally programming, which means that this charge is tunneled to the floating area of the cell to be programmed.

Adjusting and shifting charge can be done in parallel, so that a huge fraction of the sector can be filled with this information carrying charge quantities, which can finally be programmed in parallel (burst programming). In other words, having a two-dimensional array of CC EEPROM cells, first the information of all cells may be shifted under the array, and then all the information may be programmed in a single step. Because programming is time consuming (several milliseconds for Fowler Nordheim tunneling), this parallel programming dramatically speeds up the memory filling with a continuous data stream (burst).

There is no need for a special page buffer, which results in a smaller chip area due to the reduced logic in the bitline section.

The programming of a cell ends automatically, when all charge beneath the tunnel oxide is tunneled to the floating gate. A self-limiting programming is achieved, supplying a multilevel ability, even in case of fast cells.

FIGS. 5a,b show the adjust charge mode for programming a limited charge for a specific gate structure of the CC-EEPROM cell arrangement according to the embodiment of the invention.

Techniques for adjusting the charge quantity which will be programmed later on are well known from charge coupled devices (CCD filters).

First, as illustrated in FIG. 5a a continuous inversion layer INV is built up from the source 10 to the adjusting gate structure CG2, FG2 by selecting the gate structure CG1, FG1 inbetween. Moreover, the right hand neighbor gate structure CG3, FG3 is deselected.

The amount of charge $Q_{Ipr}$ is adjusted by the program adjust voltage $V_{prad}$ which is linearly related by the following formula:

$$Q_{Ipr} = -A_{ox}(C_{ox}"(V_{prad} - V_{FB} - 2\Phi_F) - \sqrt{2q\epsilon_0\epsilon_{Si}N_A(2\Phi_F + V_{SB})})) \quad (0)$$

which is valid in the case that the adjusting MOSFET does not have a floating gate. Here $\Phi_F$ is the Fermi potential, $V_{FB}$ the flatband voltage, $V_{SB}$ the source-bulk voltage, and the remaining terms are constants. If the adjusting MOSFET has a floating gate, then formula 11 below applies.

Then, with reference to FIG. 5b this adjusted charge is separated from the source 10 by deselecting the gate structure CG1, FG1 between the source 10 and the adjusting gate structure CG2, FG2.

Instead of adjusting the charge quantity by the $V_{prad}$ voltage, the desired charge amount could also be brought in via the source contact S (see FIG. 1) which would not be at a fixed potential in this case. The charge can also be delivered by a charge adjusting circuitry which is connected to the source contact.

The cell having the gate structure CG1, FG1 next to the source 10 is a dummy cell (no information storage is possible in limited charge programming mode) and in principle needs not to have a floating gate. The next cell, to which $V_{prad}$ is applied, could also be a dedicated transistor.

Adjusting can be done in parallel to reading another wordline as explained later.

FIGS. 6a–c show the charge shifting mode for shifting a limited charge for a specific gate structure of the CC-EEPROM cell arrangement according to the embodiment of the invention.

Charge shifting from one cell to another is well known and vastly documented for charge coupled devices (CCD camera, CCD filter).

The easiest way to achieve this is to interconnect the control gate of every third cell. This results in only three wordlines, which must be driven in an appropriate manner. So, a corresponding wordline section needs less control logic and less driving units, resulting in a reduced chip area.

As shown in FIG. 6a, the starting situation is identical with the situation of FIG. 5b. Additionally shown is the gate structure having control gate CG4 and floating gate FG4 which is also deselected.

Having regard to FIG. 6b, the gate structure CG3, FG3 is then selected by applying selection voltage $V_{sel}$. As a consequence, inversion layer INV expands to the gate structure CG3, FG3.

Now, as shown in FIG. 6c, the gate structure CG2, FG2 is deselected by applying deselection voltage $V_{desel}$. As a consequence, inversion layer INV contracts to the gate structure CG3, FG3 which remains selected.

By the above process sequence, the limited charge quantity is shifted from one cell to the other.

Figure 7:
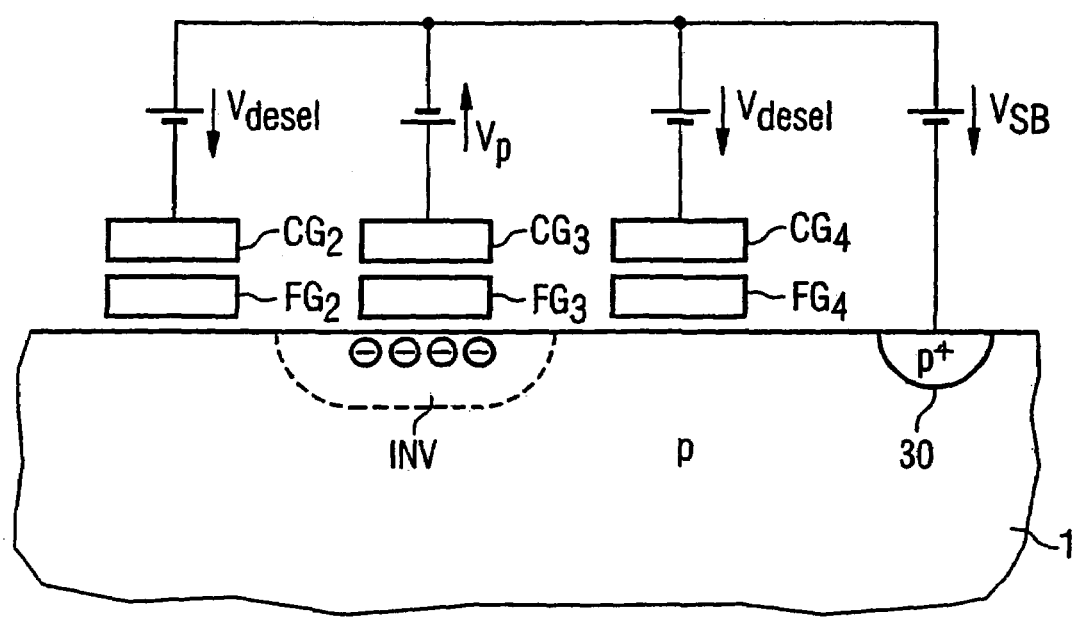
FIG. 7 shows the Fowler Nordheim programming mode for programming a limited charge for a specific gate structure of the CC-EEPROM cell arrangement according to the embodiment of the invention.

FIG. 7 shows the Fowler Nordheim programming mode for programming a limited charge for a specific gate structure of the CC-EEPROM cell arrangement according to the embodiment of the invention.

Non-volatile programming is done by applying programming voltage $V_{pr}$ to the control gates of cell having the gate structure CG3, FG3 which should be programmed, leaving the neighbor cells deselected.

The equation for the Fowler Nordheim tunneling current density according to Georg Tempel: Reprogrammable Silicon-based Non Volatile Memories. Infineon Technologies AG. CPD IPD RC IMEC: Leuven, Belgium 2001. Page 1–29, reads:

$$J_{FG} = \alpha E_{tox}^2 \varepsilon^{\frac{\beta}{E_{tox}}} \quad (1)$$

$$E_{tox} = \frac{V_{FG} - V_t}{d_{tox}} \quad (2)$$

$$\alpha = \frac{m}{m*} \frac{q^3}{8\pi h \Phi_b} \quad (3)$$

$$\beta = 4\sqrt{2m*} \frac{2\pi}{3hq} \Phi_b^{\frac{3}{2}} \quad (4)$$

with

| | | |
|---|---|---|
| h | $6.6 \cdot 10^{-34}$ Js | Planck's constant |
| $\Phi_b$ | 3.2 eV | energy barrier |
| | (Si—SiO$_2$) | at injecting interface |
| q | $1.6 \cdot 10^{-19}$ C | charge of single electron |
| m | $9.1 \cdot 10^{-31}$ kg | mass of free electron |
| m* | 0.42 m | effective mass of |
| | (SiO$_2$) | electron in band gap | and was originally derived under the assumption that the conduction band is filled with charge carriers.

However, when using the CCD principle for shifting charge beneath the floating gate in order to program, this charge is limited and steadily decreasing when charge carriers tunnel onto the floating gate during programming phase. Therefore it is assumed that the tunneling probability for each charge carrier is identical. This results in an approximately exponential tunneling current drop by time (neglecting electric field reduction due to charging of the floating gate).

Thus, using the CCD principle, a single programming procedure will approximately take 3 times longer than usually as rule of thumb. However, using burst programming, there will be still an enormous time saving compared to conventional programming time.

The limited charge programming procedure may also be done in two steps, namely first program adjust beneath the cell to be programmed (like read adjust in FIG. 5) and secondly program the charge to the floating gate as mentioned above.

Next, reading of the cells will be explained. There are two different possible reading modes, the NAND mode and the CCD mode.

The NAND mode reading provides a random access. The situation of reading in NAND mode is very similar to channel hot electron programming. Only the applied read voltage $V_{read}$ is different.

Figure 8:
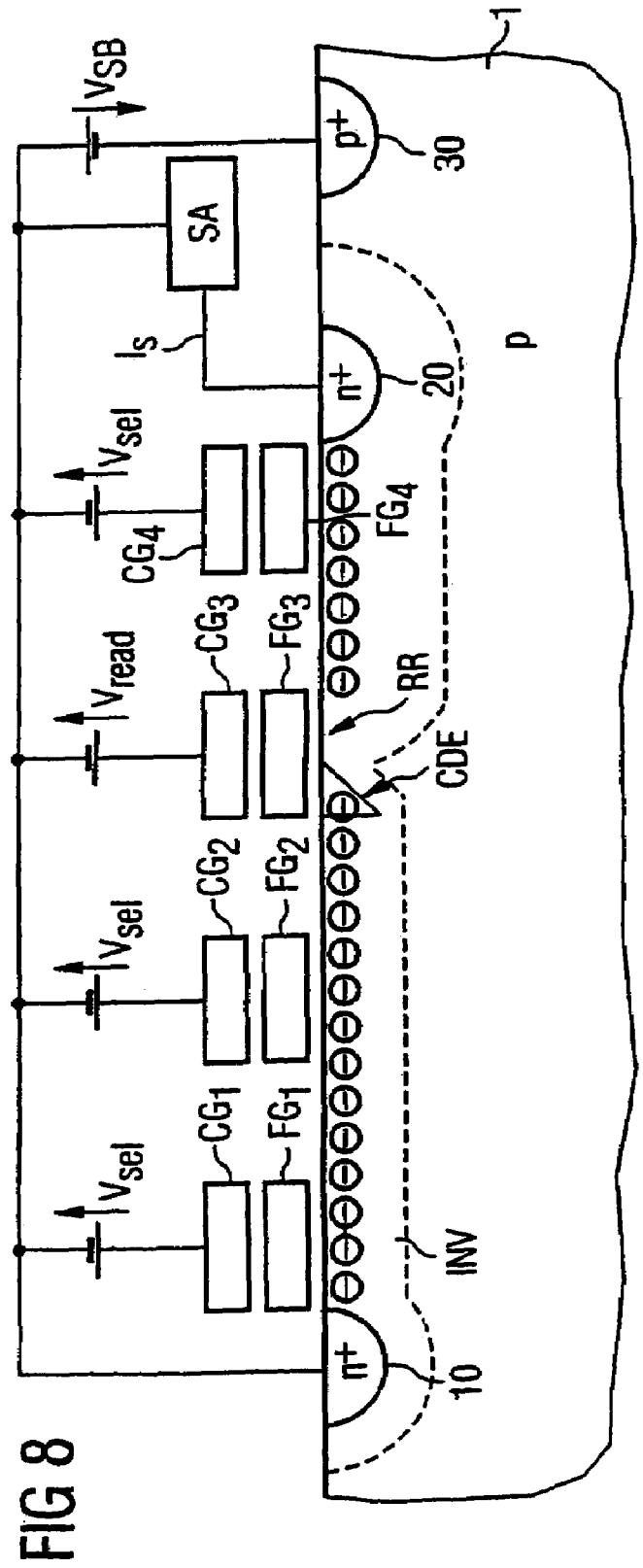
FIG. 8 shows the NAND reading mode for a specific gate structure of the CC-EEPROM cell arrangement according to the embodiment of the invention.

FIG. 8 shows the NAND reading mode for a specific gate structure of the CC-EEPROM cell arrangement according to the embodiment of the invention.

As a consequence of the applied voltages, namely $V_{sel}$ to the cells not to be read and $V_{read}$ to the cell to be read, there is a static current flow $I_s$ which may be sensed by a sense amplifier SA.

In analogy with the CCD programming mode, the CCD reading mode consists of three operation procedures: adjusting read charge, shifting charge towards the output and sensing the charge. There is no static current consumption. As a consequence of the shifting procedure, there is only a burst reading without a random access possibility.

Here, the charge density CDE in the reading region RR depends on the information stored in the cell.

Figure 9:
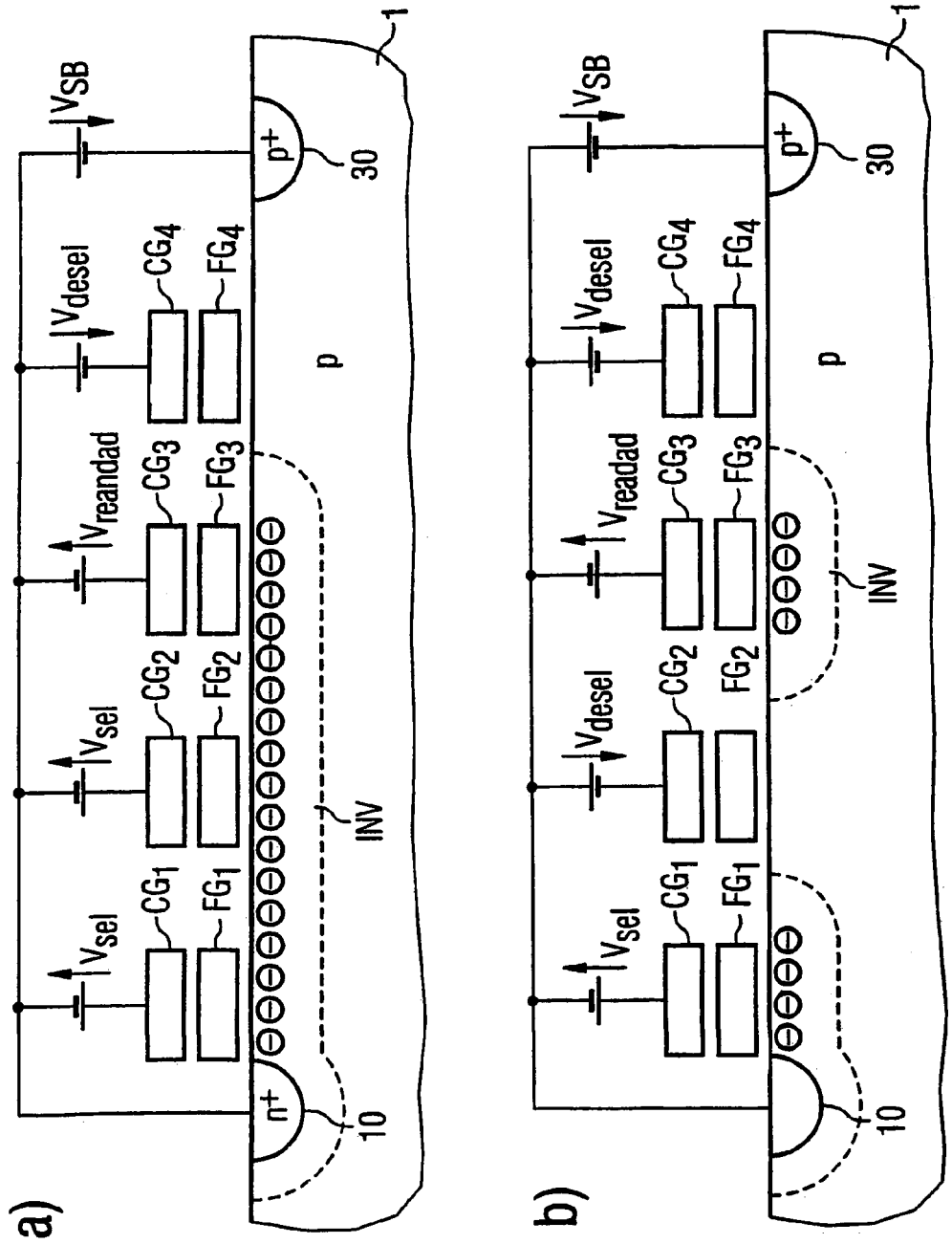
FIGS. 9a,b show the adjust charge mode for reading a limited charge for a specific gate structure of the CC-EEPROM cell arrangement according to the embodiment of the invention.

FIGS. 9a,b show the adjust charge mode for reading a specific gate structure of the CC-EEPROM cell arrangement according to the embodiment of the invention.

Adjusting the reading charge is a preparation phase for the reading. It can be done in parallel to reading another wordline.

According to FIG. 9a, an inversion layer INV is built up from the source 10 to the cell having gate structure CG3, FG3 which is to be prepared. This can be done by selecting and deselecting other cells in an appropriate manner or by another special gate structure, which is placed near by every cell.

Here, the select voltage $V_{sel}$ is applied to the two left hand cells and a deselect voltage $V_{desel}$ is applied to the right hand neighbour cell. The cell having the gate structure FG3, CG3 to be prepared is supplied with a read adjust voltage $V_{readad}$ such that the charge of the inversion layer INV under the cell is a function of the charge on the floating gate. $V_{sel}$ is greater than $V_{readad}$, so that the depletion region under the shifting cell is independent of the stored charge on the floating gate of other cells.

According to FIG. 9b, the inversion layer charge is finally separated from the continuous inversion layer INV to the source 10 by deselecting the neighbour gate having the gate structure CG2, FG2.

After adjusting the charge for reading, the charge must be shifted towards the output node by the shifting mode explained above with regard to FIG. 6.

FIGS. 10a–c show the charge sink and sense amplifier for a specific gate structure of the CC-EEPROM cell arrangement according to the embodiment of the invention.

Sensing is done in parallel to the charge shifting. The sense amplifier SA is connected to the output node, which acts as a charge sink for the shifted charge. As the output node, either the drain 20 or the source 10 can be used. The cell next to the drain 10 is a dummy cell and needs not to have a floating gate (i.e. floating gate may be omitted or floating gate and control gate may be shorted).

Sensing is well known and documented for charge coupled devices such as CCD camera, CCD filter etc. These known sensing devices proved to be capable sensing at an 8 bit resolution, and facilitate deep multilevel sensing ability for CC-EEPROM cells according to this embodiment.

According to FIG. 10a, the cell having gate structure CG2, FG2 is deselected, and the cells having gate structures CG3, FG3 and CG4, FG4 are selected. So, the charge to be read is shifted to the drain 20 from the gate structure FG3, CG3.

According to FIG. 10b, the cell having gate structure CG4, FG4 is selected, and the cells having gate structures CG2, FG2 and CG3, FG3 are deselected. So, the charge to be read is isolated at the drain 20 from the gate structure FG3, CG3.

According to FIG. 10c, the cell having gate structure CG2, FG2 is selected, and the cells having gate structures CG3, FG3 and CG4, FG4 are deselected. So, new charge to be read coming from gate structure CG1, FG1 (not shown in FIG. 10c) is transferred to the gate structure FG2, CG2.

Next, the read transfer characteristic will be evaluated. Heretofore, the following physical quantities must be considered:

| | |
|---|---|
| $C_{tox}$ | tunnel oxide capacitance |
| $C_{D,abs}$ | absolute depletion region capacitance |
| $C_{ip}$ | inter poly capacitance |
| $C_{fr}$ | fringing capacitance |
| $Q_A$ | ambient charge |
| $Q_{CG}$ | control gate charge |
| $Q_D$ | depletion region charge |
| $Q_{FG}$ | floating gate charge |
| $Q_I$ | inversion layer charge |
| $V_A$ | ambient voltage |
| $V_{CG}$ | control gate voltage |
| $V_{FG}$ | floating gate voltage |
| $V_I$ | inversion layer voltage |
| $V_b$ | bulk voltage |
| $V_{CG} = V_{adjust} - V_{FB} + V_b + V_{SB}$ (where Vadjust is the respective adjust voltage) | control gate potential |
| $V_{FB} = -kT/q \ln(N_A N_{D,CG}/n_i^2)$ | flat band voltage |
| $V_I = 2 \Phi_F + V_{SB} + V_b$ | inversion layer potential |
| $\Phi_F = kT/q \ln(N_A/n_i)$ | Fermi potential |

In order to be neutral outside of the structure, the sum of all charges must be zero.

$$Q_{FG} + Q_{CG} + Q_A + Q_I + Q_D = 0 \quad (5)$$

The equations for the oxide capacitances are $$Q_{CG} = C_{ip}(V_{CG} - V_{FG}) \quad (6)$$

$$Q_A = C_{fr}(V_A - V_{FG}) \quad (7)$$

$$Q_I + Q_D = C_{tox}(V_I - V_{FG}) \quad (8)$$

Equation (8) is rewritten to be $$V_{FG} = V_I - \frac{Q_I + Q_D}{C_{tox}} \quad (9)$$

The equation for the depletion region capacitance is $$Q_D = \sqrt{2q\epsilon_0\epsilon_{Si}N_A(V_I - V_b)} * A_{tox} \quad (10)$$

where $C_{D,abs}$ denotes an absolute capacitance. Equations (6), (7), (9) and (10) inserted in equation (5) result in $$Q_I = -\gamma Q_{FG} + Q_0 \quad (11)$$

$$\gamma = \frac{C_{tox}}{C_{tox} + C_{ip} + C_{fr}} \quad (12)$$

with $$Q_0 = \sqrt{2q\epsilon_0\epsilon_{Si}N_A(2\Phi_F - V_{SB})} * A_{tox} - \\ \gamma C_{ip}(V_{adjust} - V_{FB} - 2\Phi_F) - \\ \gamma C_{fr}(V_A - 2\Phi_F - V_{SB} - V_b) \quad (13)$$

This equation shows that the inversion layer charge is linear dependent of the floating gate charge. This clearly reveals the multilevel ability of of the CC-EEPROM cell arrangement according to the embodiment of the invention.

A volatile memory functionality of unused memory sectors is achieved by the following steps: adjusting charge quantity, shifting this charge under the desired gate structure, storage phase, shifting the charge to the output node and finally sensing the charge. This storage mode has either a first in first out or a first in last out behavior, namely dependent on what the output node is, i.e. source or drain. It can be used e.g. for storing the data to be programmed in another sector in order to realize a target programming algorithm.

FIG. 11 shows a possible two-dimensional top view of a CC-EEPROM cell arrangement according to an embodiment of the invention.

In FIG. 11, reference signs WL1–W15 denote five different wordlines arranged in parallel and equidistantly. S1–S4 and D1–D4 denote respective source and drain regions.

Between source S1 and drain D1, there are five gate structures each consisting of a floating gate and a control gate, the control gates being connected to the wordlines WL1–WL5 at contacts K11, K21, K31, K41, K51.

Between source S2 and drain D2, there are five gate structures each consisting of a floating gate and a control gate, the control gates being connected to the wordlines WL1–WL5 at contacts K12, K22, K32, K42, K52.

Between source S3 and drain D3, there are five gate structures each consisting of a floating gate and a control gate, the control gates being connected to the wordlines WL1–WL5 at contacts K13, K23, K33, K43, K53.

Between source S4 and drain D4, there are five gate structures each consisting of a floating gate and a control gate, the control gates being connected to the wordlines WL1–WL5 at contacts K14, K24, K34, K44, K54.

Not shown in FIG. 11 for simplification are isolation structures between shifting channels.

By sequentially applying appropriate voltages to the wordlines WL1–WL5 and to the source and drain regions S1–S4 and D1–D4, information can be shifted in parallel along the shifting direction SD under the gate structures of wordline WL2 and WL4 and simultaneously be programmed with a single programming burst. In analogy reading may be performed by shifting out the information in parallel along the shifting direction SD to the drains D1–D4.

In order to prove the most critical aspects to work—charge transfer, charge isolation and applying programming voltage—a device simulation was done. This simulation showed that it is possible to build up a structure, which can shift charge, isolate it and apply a programming voltage while the quantity of isolated charge is only hardly altered by leakage current and thermal generation.

Although the present invention has been described with regard to specific embodiments, it is not limited thereto, but may be modified in many ways.

Particularly, CC-EEPROM cells or arrangements can also be mixed with other, well known EEPROM cells or cell elements in order to bring in their functionality.

Just for generality, it is possible to add some more gates or doping profiles to the arrangement mentioned above, which are added perpendicular to (or better: not in the same direction of) the shifting direction SD. These means can provide additional functionality.

The floating gates of a CC-EEPROM cell can be routed out of the cell shifting area and can be connected to other structures (gate, flanked doping, transistor, tunnel oxide, ... ), in order to provide additional functionality or to combine known NVM (non-volatile memory) principles (channel hot electron, Fowler Nordheim tunneling, reading via MOSFET, ... ) or charge shifting principles (CCD) with the CC-EEPROM cell principle. So, a minimum of one CCD principle is used in order to erase, program, read non-volatile memory.

What is claimed is:

1. A semiconductor memory device, comprising:
a semiconductor substrate having a first conductivity;
a chain of gate structures including floating gates for storing charge in a non-volatile manner regularly arranged in above the surface of the semiconductor substrate and electrically isolated therefrom; and
at least one active region having a second conductivity, wherein each of the at least one active regions is individually configured to be connected to at least one of the gate structures within the chain of gate structures by interconnecting the gate structures lying between the at least one gate structure and the active region such that charge is configured to be programmed, read, shifted, and erased with respect to the gate structure, and
wherein between each of the at least one active regions and the at least one of the gate structures, a gate structure for storing charge in a volatile manner is arranged.

2. The semiconductor memory device according to claim 1, wherein a plurality of word lines is provided and a respective group of the gate structures being connected to a respective word line.

3. The semiconductor memory device according to claim 1, wherein the plurality of gate structures for storing charge in a non-volatile manner is arranged in rows and columns.

4. The semiconductor memory device according to claim 3, wherein each row has an associated first active region located at a first end of the row.

5. The semiconductor memory device according to claim 4, wherein each row has an associated second active region located at a second end of the row.

6. The semiconductor memory device according to claim 2, wherein the wordlines are located above the columns.

7. The semiconductor memory device according to claim 1, further comprising a voltage generation device for applying individual voltages between the wordlines and the active regions such that charge may be programmed, read, shifted, and erased from the gate structures.

8. The semiconductor memory device according claim 7, wherein the substrate includes a body contact which is connected to the voltage generation device for applying individual voltages between the wordlines the active regions and the substrate.

9. The semiconductor memory device according to claim 1, wherein doping of the substrate is non-uniformly under the gate structures and under a spacing between two of the gate structures.

10. The semiconductor memory device according to claim 1, further comprising a sense amplifier connected to the active regions.

11. The semiconductor memory device according to claim 1, further comprising a gate for separating the at least one active region from the gate structures to selectively connect the at least one active region to the gate structures for programming or reading the gate structures.

12. A method of operating a semiconductor memory device, the device having a semiconductor substrate having a first conductivity; a chain of gate structures including floating gates for storing charge in a non-volatile manner regularly arranged in above the surface of the semiconductor substrate and electrically isolated therefrom; and at least one active region having a second conductivity, wherein each of the at least one active regions is individually configured to be connected to at least one of the gate structures within the chain of gate structures by interconnecting the gate structures lying between the at least one gate structure and the active region such that charge is configured to be programmed, read, shifted and erased with respect to the gate structure, and the plurality of gate structures for storing charge in a non-volatile manner is arranged in rows and columns, the method comprising:

programming a gate structure by supplying its control gate with a programming voltage and by supplying the other gate structures of the corresponding row with a select voltage which is greater than the programming voltage.

* * * * *